United States Patent
Aram et al.

(10) Patent No.: US 7,411,755 B1
(45) Date of Patent: *Aug. 12, 2008

(54) WRITE DRIVER SYSTEM FOR DATA STORAGE SYSTEMS

(75) Inventors: Farbod Aram, Los Altos Hills, CA (US); Pantas Sutardja, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 155 days.

This patent is subject to a terminal disclaimer.

(21) Appl. No.: 11/511,138

(22) Filed: Aug. 28, 2006

Related U.S. Application Data

(63) Continuation of application No. 10/816,394, filed on Apr. 1, 2004, now Pat. No. 7,110,198.

(51) Int. Cl.
*G11B 5/09* (2006.01)

(52) U.S. Cl. .......................... 360/46; 360/68

(58) Field of Classification Search ............. None
See application file for complete search history.

(56) References Cited

U.S. PATENT DOCUMENTS

| | | | |
|---|---|---|---|
| 5,386,328 A | 1/1995 | Chiou et al. | 360/68 |
| 5,550,502 A | 8/1996 | Aranovsky | 327/423 |
| 5,612,828 A | 3/1997 | Brannon et al. | 360/46 |
| 5,822,141 A | 10/1998 | Chung et al. | 360/46 |
| 5,869,988 A | 2/1999 | Jusuf et al. | 327/110 |
| 6,246,269 B1 | 6/2001 | Schuler et al. | 327/110 |
| 6,429,987 B1 | 8/2002 | Cheng | 360/46 |
| 6,466,091 B1 | 10/2002 | Kejariwal et al. | 330/144 |
| 6,515,540 B1 | 2/2003 | Prasad et al. | 330/9 |
| 6,525,589 B1 | 2/2003 | Thomsen et al. | 327/379 |
| 6,813,110 B2 * | 11/2004 | Leighton et al. | 360/68 |
| 7,110,198 B1 * | 9/2006 | Aram et al. | 360/46 |

OTHER PUBLICATIONS

W. Grise, Dept. of IET, Morehead State University, Morehead, KY; Application of the Operational Transconductance Amplifier (OTA) to Voltage-controlled Amplifiers and Active Filters; 10 pages; 1998.

Axel Thomsen, Dan Kasha, Wai Lee, Crystal Semiconductor Division, Cirrus Logic, Inc., Austin, Texas; A Five Stage Chopper Stabilized Instrumentation Amplifier Using Feedforward Compensation; 1998; 4 pages.

Axel Thomsen, Edwin de Angel, Sherry Ziachong Wu, Aryesh Amar, Lei Wang, Wai Lee, WA 20.1 A DC Measurement IC with $130nV_{pp}$ Noise in 10Hz; 2000 IEEE International Solid-State Circuits Conference; 9 pages, 2000.

Axel Thomsen, Edwin de Angel, Sherry Ziachong Wu, Aryesh Amar, Lei Wang, Wai Lee, WA 20.1 A DC Measurement IC with $130nV_{pp}$ Noise in 10Hz; ISSCC 2000/Session 20/Oversampled Converters/Paper WA 20.1 ISSCC 2000 Slide Supplement; 5 pages, 2000.

(Continued)

*Primary Examiner*—Andrea Wellington
*Assistant Examiner*—Dan I Davidson

(57) ABSTRACT

A write driver system comprises first switching devices that generate gate drive signals. A write driver circuit includes second switching devices that are controlled by the gate drive signals. The second switching devices have higher voltage stress thresholds than the first switching devices and wherein the second switching devices have slower switching times than the first switching devices.

24 Claims, 6 Drawing Sheets

OTHER PUBLICATIONS

M. Moyal, M. Groepl. H. Werker, G. Mitteregger, J. Schambacher; Xignal Technologies AG, Munich, Germany; 23.6 A 700/900mW/Channel CMOS Dual Analog Front-End IC for VDSL with Integrated 11.5/14.5dBm Line Drivers; 2003 IEEE International Solid-State Circuits Conference; ISSCC 2003/Session 23/Mixed-Signal and Wireline Techniques; 10 pages, 2003.

M. Moyal, M. Groepl, H. Werker, G. Mitteregger, J. Schambacher; Xignal Technologies AG, Munich, Germany; A 700/900mW/Channel CMOS Dual Analog Front-End IC for VDSL with Integrated 11.5/14.5dBm Line Drivers; Outline, Overview 24 pages, 2003.

* cited by examiner

| Control Signal | $I_L$ | | $-I_L$ | |
|---|---|---|---|---|
| | Boost | Write | Boost | Write |
| $B_L$ | ON | OFF | OFF | OFF |
| $C_L$ | ON | ON | OFF | OFF |
| $C_L'$ | ON | ON | OFF | OFF |
| $B_L'$ | ON | OFF | OFF | OFF |
| $B_R$ | OFF | OFF | ON | OFF |
| $C_R$ | OFF | OFF | ON | ON |
| $C_R'$ | OFF | OFF | ON | ON |
| $B_R'$ | OFF | OFF | ON | OFF |
| $I_{WL}$ | OFF | ON | OFF | OFF |
| $I_{WL}'$ | OFF | ON | OFF | OFF |
| $I_{WR}$ | OFF | OFF | OFF | ON |
| $I_{WR}'$ | OFF | OFF | OFF | ON |

FIG. 6

WRITE DRIVER SYSTEM FOR DATA STORAGE SYSTEMS

CROSS-REFERENCE TO RELATED APPLICATIONS

This application is a continuation of U.S. patent application Ser. No. 10/816,394 filed on Apr. 1, 2004. The disclosure of the above application is incorporated herein by reference.

FIELD OF THE INVENTION

The present invention relates to data storage systems, and more particularly to a write driver system for a write head in a magnetic data storage system.

BACKGROUND OF THE INVENTION

Referring now to FIG. 1, an exemplary data storage device 20 is shown. A buffer 24 stores data that is associated with the control of a hard disk drive. The buffer 24 may employ SDRAM or other types of low latency memory. A processor 26 performs processing that is related to the operation of the hard disk drive. A hard disk controller (HDC) 30 communicates with the buffer 24, the processor 26, a host 34, a spindle/voice coil motor (VCM) driver 36, and/or a read/write channel circuit 40.

During a write operation, the read/write channel circuit (or read channel circuit) 40 encodes the data to be written onto the storage medium. The read channel circuit 40 processes the signal for reliability and may include, for example error correction coding (ECC), run length limited coding (RLL), and the like. During read operations, the read channel circuit 40 converts an analog output from the medium to a digital signal. The converted signal is then detected and decoded by known techniques to recover the data written on the hard disk drive.

One or more hard drive platters 42 include a magnetic coating that stores magnetic fields. The platters 42 are rotated by a spindle motor that is schematically shown at 44. Generally the spindle motor 44 rotates the hard drive platter 42 at a fixed speed during the read/write operations. One or more read/write arms 46 move relative to the platters 42 to read and/or write data to/from the hard drive platters 42. The spindle/VCM driver 36 controls the spindle motor 44, which rotates the platter 42. The spindle/VCM driver 36 also generates control signals that position the read/write arm 46, for example using a voice coil actuator, a stepper motor or any other suitable actuator.

A read/write device 48 is located near a distal end of the read/write arm 46. The read/write device 48 includes a write element such as an inductor that generates a magnetic field. The read/write device 48 also includes a read element (such as a magneto-resistive (MR) sensor) that senses the magnetic fields on the platter 42. A preamplifier (preamp) circuit 50 amplifies analog read/write signals. When reading data, the preamp circuit 50 amplifies low level signals from the read element and outputs the amplified signal to the read channel circuit 40. While writing data, a write current that flows through the write element of the read/write device 48 is switched to produce a magnetic field having a positive polarity or negative polarity. The positive or negative polarity is stored by the hard drive platter 42 and is used to represent data. Data storage rates of these systems are proportional to a rate that the write driver circuit can change the direction of the write current through the write head.

SUMMARY OF THE INVENTION

A write driver system according to the present invention comprises a control circuit that includes first switching devices and that generates gate drive signals. A write driver circuit includes second switching devices that are controlled by the gate drive signals from the control circuit. The second switching devices have higher voltage thresholds than the first switching devices. The second switching devices have slower switching times than the first switching devices.

In other features, the write driver circuit generates a boost current followed by a write current when transitioning from one magnetic polarity to an opposite magnetic polarity during write operations. The control circuit includes a logic circuit that generates N control signals. N predriver circuits receive respective ones of the N control signals.

In other features, the gate drive signals are output by the N predriver circuits. The gate drive signals exceed the voltage thresholds of the first switching devices of the N predriver circuits and do not exceed the voltage thresholds of the second switching devices of the write driver circuit. At least one of the N predriver circuits includes a first inverter that has an input that receives one of the N control signals and an output. First, second and third latches have inputs that are capacitively coupled to the output of the first inverter.

In still other features, the at least one of the N predriver circuits further includes a second inverter that has an input coupled to the output of the first inverter and an output. A third inverter has an input coupled to the output of the second inverter. Fourth, fifth and sixth inverters have inputs that are coupled to outputs of the first, second and third latches and capacitively coupled to the output of the second inverter.

In still other features, the at least one of the N predriver circuits further includes first, second, third, fourth, fifth, sixth, seventh and eighth switches, each having a control terminal and first and second terminals. The control terminal of the first switch communicates with the output of the fourth inverter. The control terminal of the fourth switch communicates with the output of the third inverter. The control terminal of the fifth switch communicates with the output of the fifth inverter. The control terminal of the eighth switch communicates with the output of the sixth inverter. A voltage supply provides first and second positive voltage potentials, first and second negative voltage potentials and a reference potential. The first terminal of the first switch communicates with the first positive voltage potential. The first terminal of the second switch communicates with the second terminal of the first switch. The second terminal of the second switch communicates with the first terminal of the third switch. The second terminal of the third switch communicates with the first terminal of the fourth switch and the second terminal of the fourth switch communicates with the reference potential.

In still other features, the second terminal of the eighth switch communicates with the first negative voltage potential. The second terminal of the seventh switch communicates with the first terminal of the eighth switch. The first terminal of the seventh switch communicates with the second terminal of the sixth switch. The first terminal of the sixth switch communicates with the second terminal of the fifth switch and the first terminal of the fifth switch communicates with the reference potential.

In other features, the first, second and third inverters are biased by the second positive voltage potential and the reference potential. The first latch and the fourth inverter are biased by the first positive voltage potential and the second positive voltage potential. The second latch and the fifth inverter are biased by the second negative voltage potential and the reference potential. The third latch and the sixth inverter are biased by the first negative voltage potential and the second negative voltage potential. The first, second, fifth and sixth switches include PMOS transistors and the third, fourth, seventh and eighth switches include NMOS transistors.

In other features, a voltage supply provides first and second positive voltage potential and first and second negative voltage potentials. The write driver circuit selectively connects the first positive and negative voltage potentials across a write head during the boost stage and the second positive and negative voltage potentials across the write head during the write stage. First, second, third, and fourth switches are connected in series between the first positive voltage potential and the first negative voltage potential. Fifth, sixth, seventh, and eighth switches are connected in series between the first positive voltage potential and the first negative voltage potential. Ninth and eleventh switches have first terminals that receive the second positive voltage potential and second terminals that communicate with the first and second switches and the fifth and sixth switches. Tenth and twelfth switches have first terminals that receive the second negative voltage potential and second terminals that communicate with the third and fourth switches and the seventh and eighth switches.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 6 is a table illustrating ON/OFF states of the switching devices in the write drive circuit during boost and write current stages.

DETAILED DESCRIPTION OF THE PREFERRED EMBODIMENTS

Figure 1:
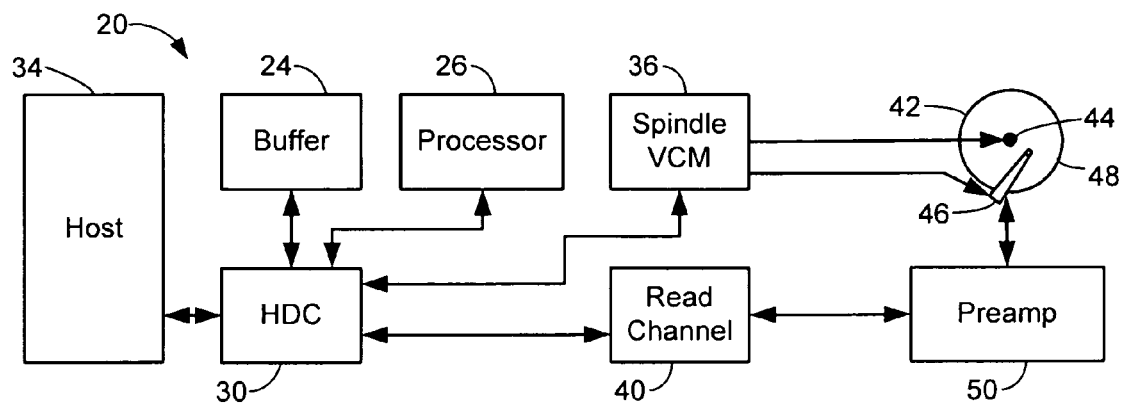
FIG. 1 is a functional block diagram of an exemplary data storage device according to the prior art.

The following description of the preferred embodiments is merely exemplary in nature and is in no way intended to limit the invention, its application, or uses. For purposes of clarity, the same reference numbers will be used in the drawings to identify similar elements.

Figure 2A:
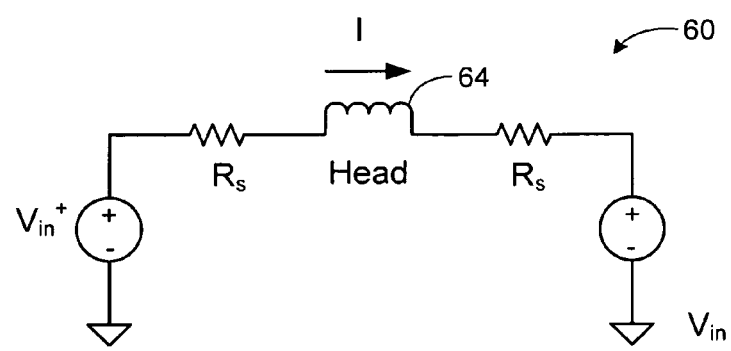
FIG. 2A is an electrical schematic of a simplified write driver circuit according to one embodiment of the present invention.
Figure 2B:
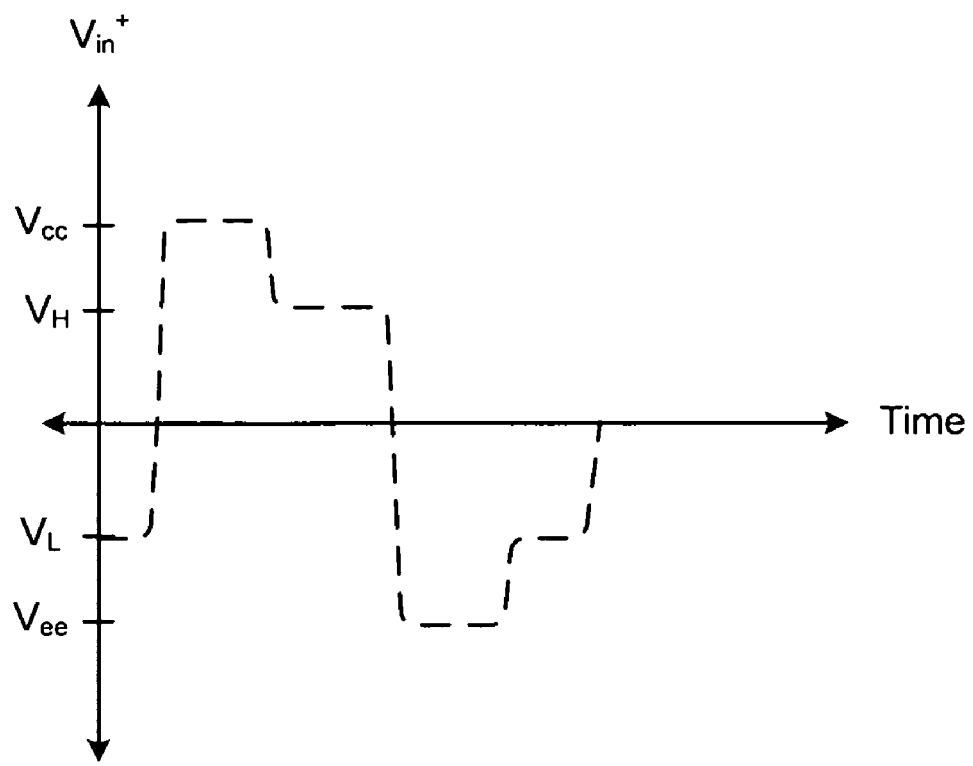
FIGS. 2B and 2C are graphs showing exemplary write voltage waveforms and write current waveforms, respectively.
Figure 2C:
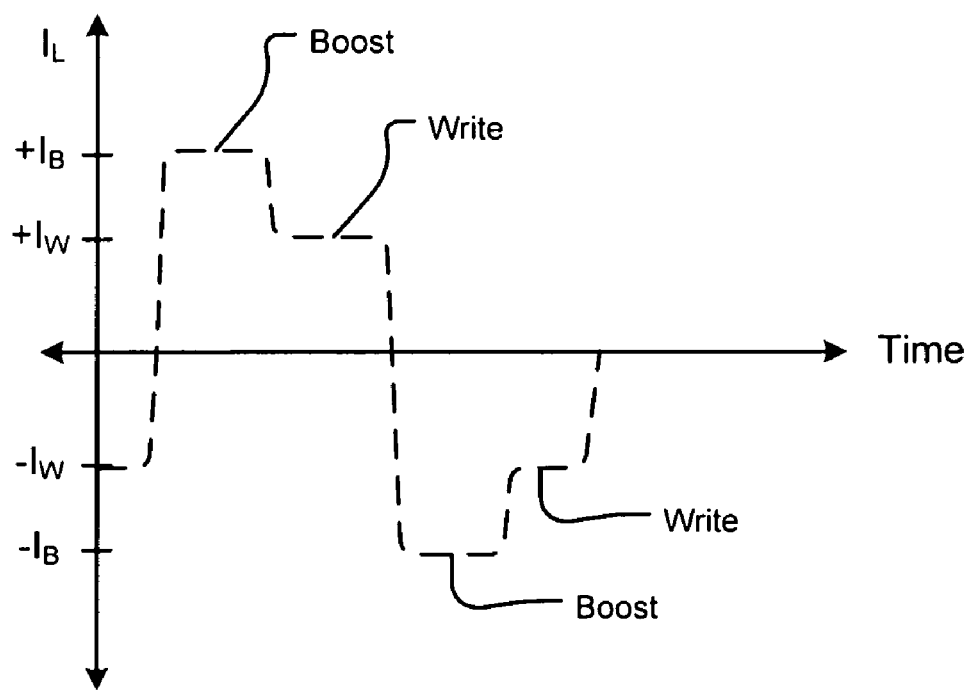

Referring now to FIGS. 2A, 2B and 2C, an exemplary write drive circuit 60 in accordance with the present invention is shown. While the following description describes the write drive circuit 60 in conjunction with a write head 64 of a magnetic data storage device, it should be understood that the write driver circuit 60 may be useful in other data storage applications.

The write driver circuit 60 switches the direction of current $I_L$ flowing through the write head 64 of a magnetic storage device. As shown in FIG. 2C, the head current $I_L$ may initially have a negative write current value $-I_W$ for writing a magnetic field having one polarity onto a magnetic storage medium. The head current $I_L$ may then transition to a positive boost current $I_B$ to quickly reverse current flow in the write head 64. The head current $I_L$ may then decrease to a lower positive write current value $I_W$ to write a magnetic field having an opposite polarity onto the magnetic storage medium. The head current $I_L$ may then transition to a negative boost current value $-I_B$ to quickly reverse current flow in the write head. Then, the head current $I_L$ transitions to the negative write current value $-I_W$ to write. As can be appreciated, the timing of the write current will vary from that shown in FIGS. 2B and 2C.

The write driver circuit 60 that is shown in FIG. 2A has several advantages. The write driver circuit 60 maintains a common mode voltage level across the write head 64 with minimal fluctuation during operation. Further, the write driver circuit 60 operates in a voltage mode (i.e., the current through the write head 64 is controlled by controlling voltage potentials across the write head). The write driver circuit 60 has substantially constant output impedance at very high operating frequencies. The write head 64 sees an impedance that is predominantly resistive during operation. The write driver circuit 60 balances both differential and common mode resistance. The common mode and differential resistance is also independent of the magnitude of the write current.

Figure 3:
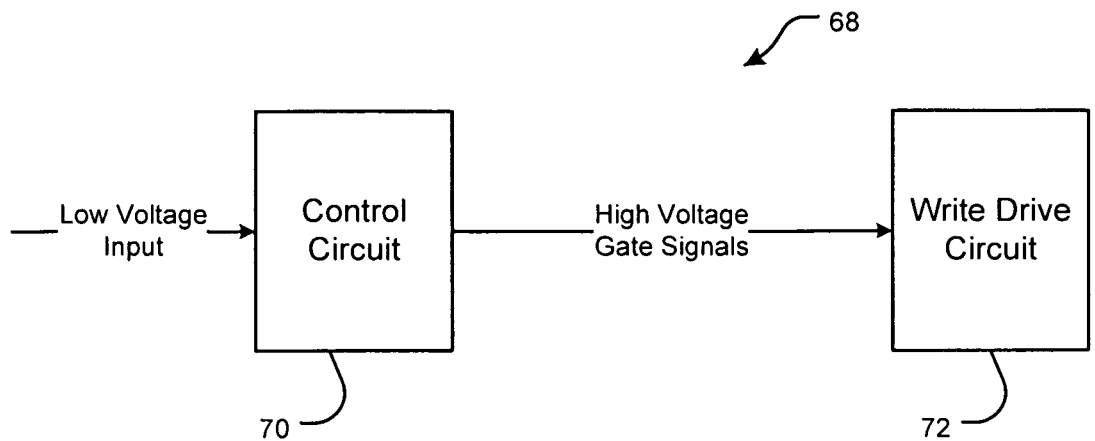
FIG. 3 is a functional block diagram illustrating a write driver system including a control circuit and a write drive circuit for a data storage system according to the present invention.

Referring now to FIG. 3, a write driver system 68 according to the present invention includes a control circuit 70 and a write drive circuit 72. The control circuit 70 is preferably implemented using low voltage switching devices that have relatively fast switching times. However, the write drive circuit 72 is preferably implemented using higher voltage switching devices having slower switching times. The higher voltage capacity of the switching devices in the write drive circuit 72 allows higher boost and write currents. The lower capacity/faster switching of the switching devices in the control circuit 70 enables fast switching and increased data density. For example, the low voltage switching devices may include transistors that experience voltage stress above 1.8V and the high voltage switching devices may include transistors that experience voltage stress above 3.6V. However, skilled artisans will appreciate that switching devices having other voltage stress levels may be used.

Figure 4:
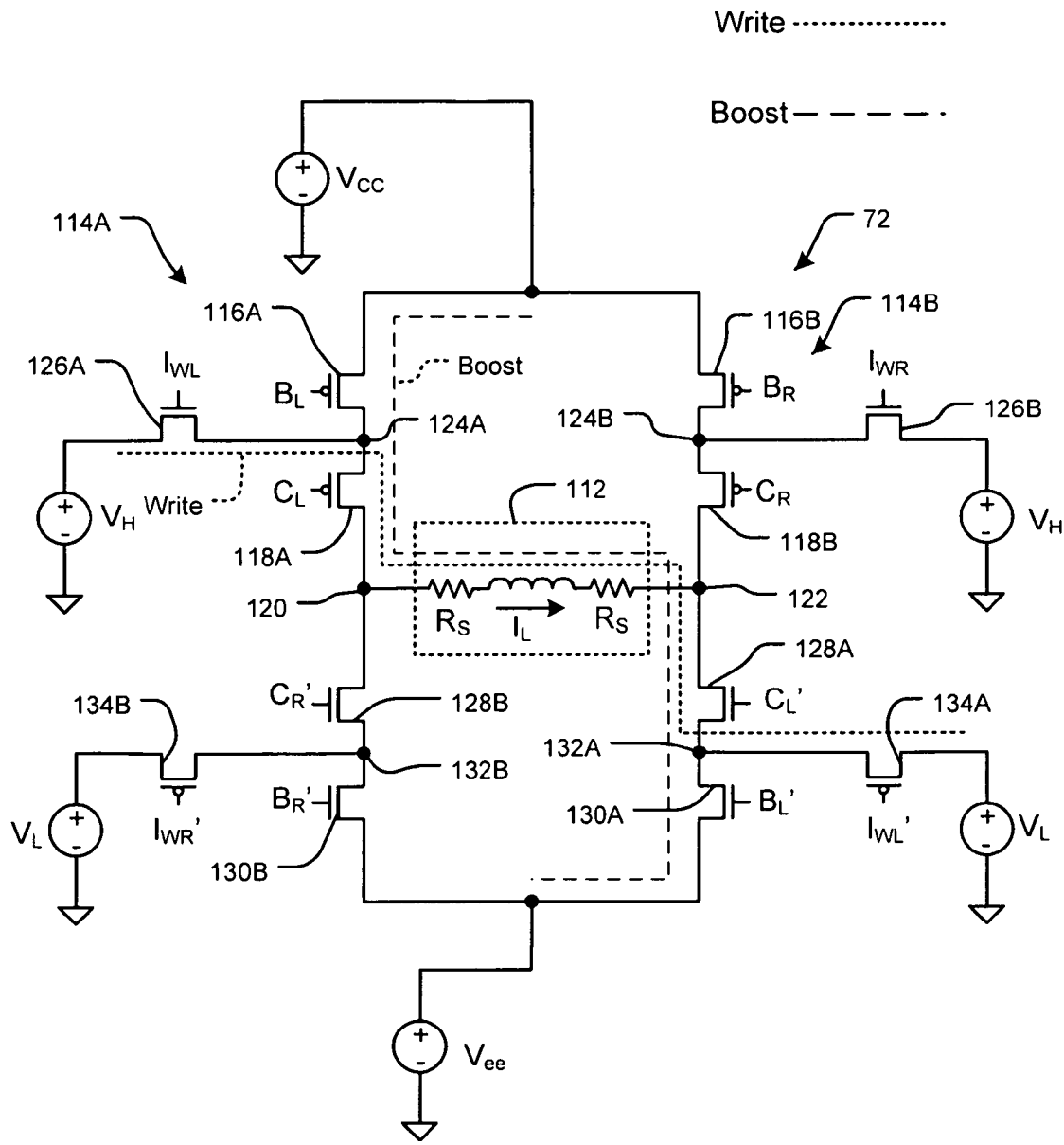
FIG. 4 is an electrical schematic of the write drive circuit of FIG. 3 in further detail.

Referring now to FIG. 4, the write driver circuit 72 includes a write head 112 that has opposite ends that are connected to sub-circuits 114A and 114B, respectively. For purposes of illustration, the sub-circuit 114A is described further below. Since the sub-circuits 114A and 114B are symmetric, the same reference numbers and/or other identification will be used followed by A to identify features of sub-circuit 114A and B to identify features of sub-circuit 114B.

The sub-circuit 114A includes a switching device 116A that is connected in series with a switching device 118A between a voltage source $V_{cc}$ and one side of the write head 112. In particular, the switching device 118A is coupled to node 120, which is coupled through the write head 112 (including resistances $R_s$) to node 122 on the other side of the write head 112. Switching device 116A is connected in series with switching device 118A through a node 124A. A switching device 126A is coupled between the node 124A and a voltage source $V_H$.

Similar to the upper left portion of the write driver circuit 72, sub-circuit 114A includes a switching device 128A connected in series with a switching device 130A between node 122 and a voltage source $V_{ee}$. In particular, switching device 128A is coupled to switching device 130A through a node 132A. A switching device 134A is coupled between node 132A and a voltage source $V_L$.

Operation of switching devices 116A, 116B, 118A, 118B, 126A and 126B are controlled by control signals $B_L$, $B_R$, $C_L$, $C_R$, $I_{WL}$ and $I_{WR}$, respectively. Similarly, operation of switching devices 128A, 128B, 130A, 130B, 134A and 134B are controlled by control signals $C_L'$, $C_R'$, $B_L'$, $B_R'$, $I_{WL}'$ and $I_{WR}'$, respectively. The prime symbols denote that the waveforms of control signals $C_L'$, $C_R'$, $B_L'$, $B_R'$, $I_{WL}'$ and $I_{WR}'$ are compliments of the waveforms of control signals $C_L$, $C_R$, $B_L$, $B_R$, $I_{WL}$ and $I_{WR}$, respectively.

For the embodiment of the write driver circuit 72 shown in FIG. 4, voltage source $V_{cc} > V_H > V_L > V_{ee}$. For example, $V_{cc}$ may be 3.6V, $V_H$ may be 1.8V, $V_L$ may be −1.8V, and $V_{ee}$ may be −3.6V, although other voltage levels may be used. By turning switching devices 116A, 118A, 128A and 130A on (while the other switching devices are off), a positive boost current $I_B$ flows from voltage source $V_{cc}$, through switching devices 116A and 118A, through the write head 112 from left to right in FIG. 4 and through switching devices 128A and 130A to voltage source $V_{ee}$. Thereafter, by turning switching devices 116A and 130A off and turning switching devices 126A and 134A on, a positive write current $I_W$ flows from voltage source $V_H$ through switches 126A and 118A, through the write head 112 from left to right in FIG. 4 and through switches 128A and 134A to the voltage source $V_L$.

Conversely, by turning on switching devices 116B, 118B, 128B and 130B (with the other switching devices turned off), a boost current flows from voltage source $V_{cc}$, through switching devices 116B and 118B, through the write head 112 from right to left in FIG. 4 and through switching devices 128B and 130B to the voltage source $V_{ee}$. Thereafter, by turning off switching devices 116B and 130B and turning on switching devices 126B and 134B, a write current flows from the voltage source $V_H$, through switching devices 126B and 118B, through the write head 112 from right to left in FIG. 4 and through switching devices 128B and 134B to the voltage source $V_L$.

Because the voltage potential provided between voltage sources $V_{cc}$ and $V_{ee}$ is greater than the voltage potential provided between voltage sources $V_H$ and $V_L$, the boost current $I_B$ is greater than the write current $I_W$, as shown in FIG. 2C.

Figure 5:
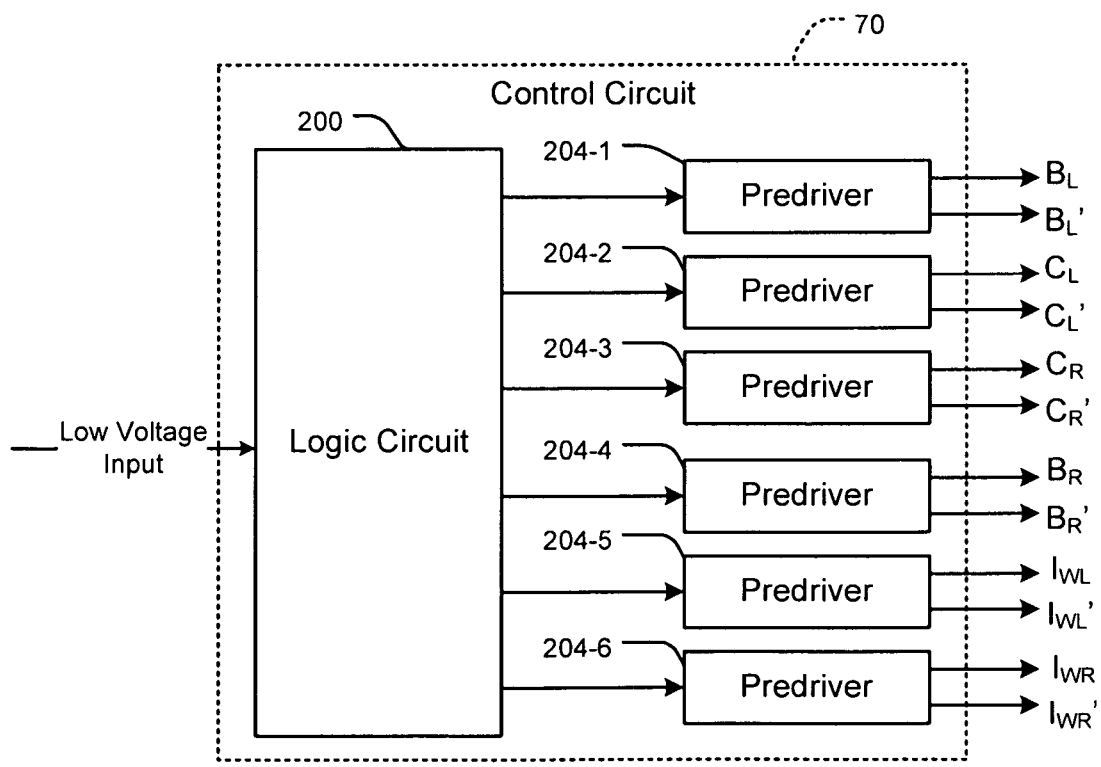
FIG. 5 is a more detailed functional block diagram of the control circuit of FIG. 3.

Referring now to FIGS. 5 and 6, the control circuit 70 is shown in further detail and includes a logic circuit 200 and predriver circuits 204-1, 204-2, . . . , 204-6 (collectively predriver circuits 204). The logic circuit 200 receives low voltage write signals and generates corresponding low voltage control signals for the predriver circuits 204. The predriver circuits 204, in turn, generate high voltage gate control voltages for the switching devices in the write drive circuit 72. The predriver circuits 204 are also implemented using low voltage, high speed switching devices as will be described below. For example, the predriver circuit 204-1 generates complementary gate drive signals $B_L$ and $B_L'$. Other predriver circuits 204-2, 204-3, . . . , and 204-6 generate the other drive signals in FIG. 4. A truth table for the logic circuits is shown in FIG. 6. The truth table parallels the switching of the circuits that is described above.

In the embodiment of the write driver circuit 10 that is shown in FIG. 4, switching devices 116A, 116B, 118A, 118B, 134A and 134B are implemented as PMOS transistors. Conversely, switching devices 126A, 126B, 128A, 128B, 130A and 130B are implemented as NMOS transistors. It should be understood, however, that other types of transistors and/or switching devices may be employed without departing from the principles of the present invention.

Figure 7:
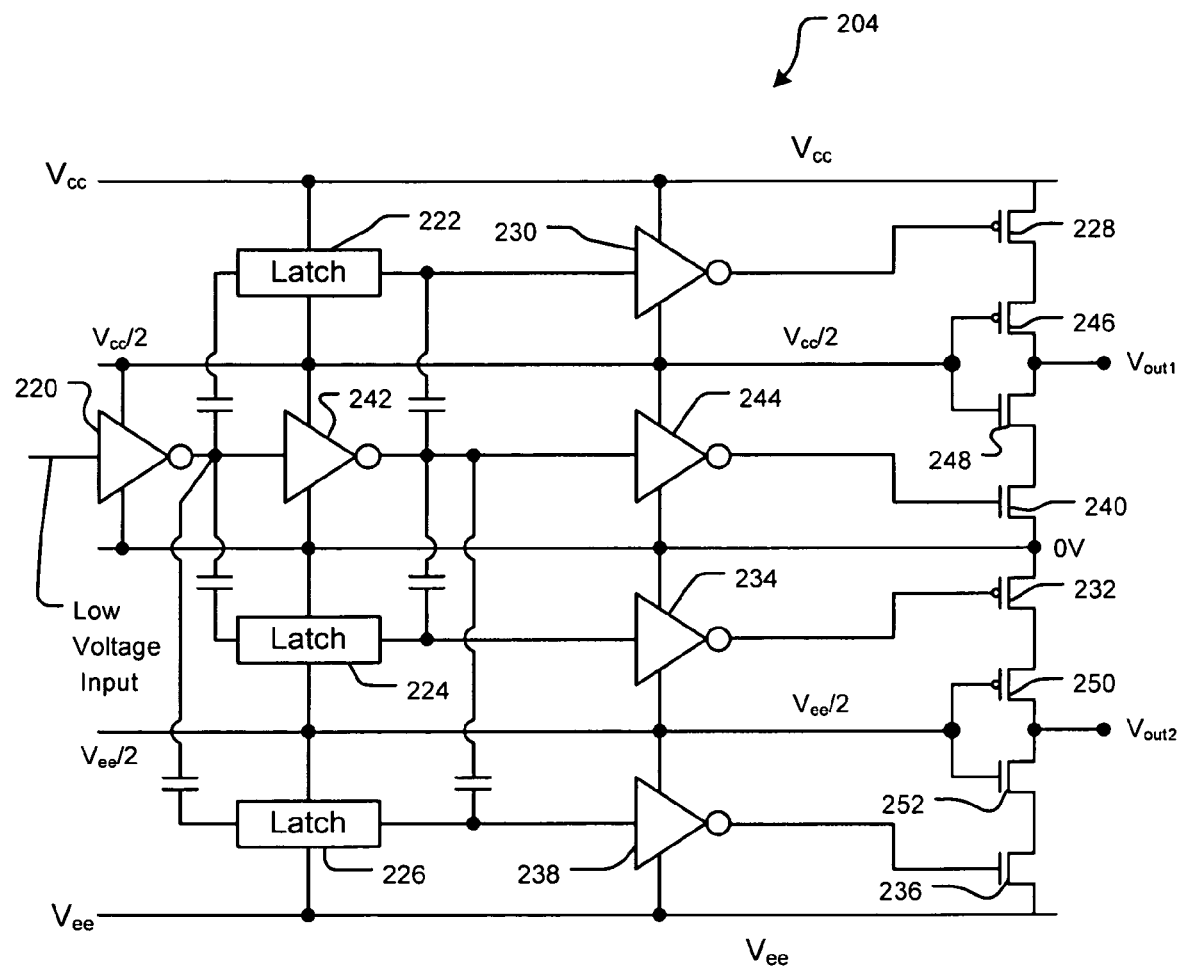
FIG. 7 is an electrical schematic and functional block diagram of the predriver circuit of FIG. 5.

Referring now to FIG. 7, one suitable predriver circuit 204 is shown. A low voltage write input is provided to an inverter 220. An output of the inverter 220 is capacitively coupled to three latch circuits 222, 224, and 226. Latch 222 is biased by 1.8V and 3.6V, latch 224 is biased by 0 and −1.8V, and latch 226 is biased by −1.8V and −3.6V. In one embodiment, the latches include anti-parallel inverters. The output of latch 222 communicates with the gate input of a transistor 228 via an inverter 230. Similarly, the output of latch 224 communicates with the gate input of a transistor 232 via an inverter 234. The output of latch 226 communicates with a gate of a transistor 236 via an inverter 238. The output of the inverter 220 also communicates with a gate of a transistor 240 via inverters 242 and 244. The output signals $V_{out1}$ and $V_{out2}$ are taken between the transistors 246 and 248 and between the transistors 250 and 252, respectively. For example, $V_{out1} = B_L$ and $V_{out2} = B_L'$ in predriver circuit 204-1. By employing low voltage devices with level shifting, the logic circuit of FIG. 7 provides faster switching than a typical logic circuit employing high voltage devices.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A write driver system, comprising:
    first switching devices that generate gate drive signals; and
    a write driver circuit that includes second switching devices that are controlled by said gate drive signals,
    wherein said second switching devices have higher voltage stress thresholds than said first switching devices and wherein said second switching devices have slower switching times than said first switching devices.

2. The write driver system of claim 1 wherein said write driver circuit generates a boost current followed by a write current when transitioning from one magnetic polarity to an opposite magnetic polarity during write operations.

3. The write driver system of claim 1 further comprising a control circuit that includes:
    said first switching devices; and
    a logic circuit that generates N control signals,
    said first switching devices including N predriver circuits that receive respective ones of said N control signals, where N is an integer greater than zero.

4. The write driver system of claim 3 wherein said gate drive signals are output by said N predriver circuits and wherein said gate drive signals exceed said voltage stress thresholds of said first switching devices of said N predriver circuits and do not exceed said voltage stress thresholds of said second switching devices of said write driver circuit.

5. The write driver system of claim 3 wherein at least one of said N predriver circuits includes:
    a first inverter that has an input that receives one of said N control signals and an output; and first, second and third latches that have inputs that are capacitively coupled to said output of said first inverter.

6. The write driver system of claim 5 wherein said at least one of said N predriver circuits further includes:
a second inverter that has an input coupled to said output of said first inverter and an output;
a third inverter having an input coupled to said output of said second inverter; and
fourth, fifth and sixth inverters that have inputs that are coupled to outputs of said first, second and third latches and capacitively coupled to said output of said second inverter.

7. The write driver system of claim 6 wherein said at least one of said N predriver circuits further includes:
first, second, third, fourth, fifth, sixth, seventh and eighth switches, each having a control terminal and first and second terminals, wherein said control terminal of said first switch communicates with said output of said fourth inverter, said control terminal of said fourth switch communicates with said output of said third inverter, said control terminal of said fifth switch communicates with said output of said fifth inverter, and said control terminal of said eighth switch communicates with said output of said sixth inverter.

8. The write driver system of claim 7 further comprising a voltage supply that provides first and second positive voltage potentials, first and second negative voltage potentials and a reference potential.

9. The write driver system of claim 8 wherein said first terminal of said first switch communicates with said first positive voltage potential, said first terminal of said second switch communicates with said second terminal of said first switch, said second terminal of said second switch communicates with said first terminal of said third switch, said second terminal of said third switch communicates with said first terminal of said fourth switch and said second terminal of said fourth switch communicates with said reference potential.

10. The write driver system of claim 8 wherein said second terminal of said eighth switch communicates with said first negative voltage potential, said second terminal of said seventh switch communicates with said first terminal of said eighth switch, said first terminal of said seventh switch communicates with said second terminal of said sixth switch, said first terminal of said sixth switch communicates with said second terminal of said fifth switch and said first terminal of said fifth switch communicates with said reference potential.

11. The write driver system of claim 8 wherein said first, second and third inverters are biased by said second positive voltage potential and said reference potential.

12. The write driver system of claim 8 wherein said first latch and said fourth inverter are biased by said first positive voltage potential and said second positive voltage potential.

13. The write driver system of claim 8 wherein said second latch and said fifth inverter are biased by said second negative voltage potential and said reference potential.

14. The write driver system of claim 8 wherein said third latch and said sixth inverter are biased by said first negative voltage potential and said second negative voltage potential.

15. The write driver system of claim 7 wherein said first, second, fifth and sixth switches include PMOS transistors and said third, fourth, seventh and eighth switches include NMOS transistors.

16. The write driver system of claim 1 further comprising:
a write head; and
a voltage supply that provides first and second positive voltage potentials and first and second negative voltage potentials, wherein said write driver circuit selectively connects said first positive and negative voltage potentials across said write head during said boost stage and said second positive and negative voltage potentials across said write head during said write stage.

17. The write driver system of claim 16 wherein said write driver circuit includes:
first, second, third, and fourth switches that are connected in series between said first positive voltage potential and said first negative voltage potential;
fifth, sixth, seventh, and eighth switches that are connected in series between said first positive voltage potential and said first negative voltage potential; and
ninth and eleventh switches that have first terminals that receive said second positive voltage potential and second terminals that communicate with said first and second switches and said fifth and sixth switches; and
tenth and twelfth switches that have first terminals that receive said second negative voltage potential and second terminals that communicate with said third and fourth switches and said seventh and eighth switches.

18. A magnetic storage system comprising the write driver system of claim 1.

19. The write driver system of claim 3 where in N=6.

20. A method for operating a write driver, comprising:
controlling gate drive signals using first switching devices; and
controlling a write current using second switching devices that are switched by said gate drive signals,
wherein said second switching devices have higher voltage stress thresholds and slower switching times than said first switching devices.

21. The method of claim 20 further comprising generating a boost current before said write current when transitioning from one magnetic polarity to an opposite magnetic polarity during write operations.

22. The method of claim 20 further comprising:
generating N control signals; and
generating said gate drive signals based on said N control signals.

23. The method of claim 20 wherein said gate drive signals exceed said voltage stress thresholds of said first switching devices and do not exceed said voltage stress thresholds of said second switching devices.

24. The method of claim 20 further comprising selectively supplying first positive and negative voltage potentials across a write head during said boost stage and second positive and negative voltage potentials across said write head during said write stage.

* * * * *

UNITED STATES PATENT AND TRADEMARK OFFICE
CERTIFICATE OF CORRECTION

| | |
|---|---|
| PATENT NO. | : 7,411,755 B1 |
| APPLICATION NO. | : 11/511138 |
| DATED | : August 12, 2008 |
| INVENTOR(S) | : Farbod Aram |

It is certified that error appears in the above-identified patent and that said Letters Patent is hereby corrected as shown below:

Column 8, Line 32    Delete "where in" and insert -- wherein --

Signed and Sealed this

Seventh Day of October, 2008

JON W. DUDAS
*Director of the United States Patent and Trademark Office*